United States Patent
Rahim et al.

(10) Patent No.: US 7,348,827 B2
(45) Date of Patent: Mar. 25, 2008

(54) APPARATUS AND METHODS FOR ADJUSTING PERFORMANCE OF PROGRAMMABLE LOGIC DEVICES

(75) Inventors: Irfan Rahim, San Jose, CA (US); Peter McElheny, Morgan Hill, CA (US); Yow-Juang W. Liu, San Jose, CA (US); Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/848,953

(22) Filed: May 19, 2004

(65) Prior Publication Data

US 2005/0258862 A1    Nov. 24, 2005

(51) Int. Cl.
G05F 3/02    (2006.01)
(52) U.S. Cl. .................. 327/534; 327/537; 326/32; 326/39
(58) Field of Classification Search ................ 327/534, 327/537; 257/500; 326/38, 39, 41
See application file for complete search history.

(56) References Cited

U.S. PATENT DOCUMENTS

| | | | |
|---|---|---|---|
| 5,341,034 A | 8/1994 | Matthews | |
| 5,422,591 A | 6/1995 | Rastegar et al. | |
| 5,610,533 A | 3/1997 | Arimoto et al. | |
| 5,689,144 A | 11/1997 | Williams | |
| 5,703,522 A | 12/1997 | Arimoto et al. | |
| 5,744,996 A | 4/1998 | Kotzle et al. | |
| 5,841,694 A | 11/1998 | Wong | |
| 5,852,552 A | 12/1998 | Kwon | |
| 5,854,561 A | 12/1998 | Arimoto et al. | |
| 5,905,402 A | 5/1999 | Kim et al. | |
| 5,942,784 A | 8/1999 | Harima et al. | |
| 6,020,758 A * | 2/2000 | Patel et al. | 326/40 |
| 6,147,508 A | 11/2000 | Beck et al. | |
| 6,147,511 A * | 11/2000 | Patel et al. | 326/81 |
| 6,232,793 B1 | 5/2001 | Arimoto et al. | |
| 6,271,713 B1 | 8/2001 | Krishnamurthy | |
| 6,292,639 B1 | 9/2001 | Inoue et al. | |
| 6,343,044 B1 | 1/2002 | Hsu et al. | |
| 6,351,176 B1 | 2/2002 | Houston | |
| 6,366,156 B1 * | 4/2002 | Narendra et al. | 327/534 |
| 6,366,482 B1 | 4/2002 | Jeong | |

(Continued)

FOREIGN PATENT DOCUMENTS

EP    0732 796    9/1996

OTHER PUBLICATIONS

Search Report; PCT/US2005/017266; 14 pgs.; copy enclosed; Date of Mailing Jan. 23, 2006.

(Continued)

Primary Examiner—Vibol Tan
(74) Attorney, Agent, or Firm—Law Offices of Maximilian R. Peterson

(57) ABSTRACT

A programmable logic device (PLD) includes mechanisms for adjusting or setting the body bias of one or more transistors. The PLD includes a body-bias generator. The body-bias generator is configured to set a body bias of one or more transistors within the programmable logic device. More specifically, the body-bias generator sets the body bias of the transistor(s) so as to trade off performance and power consumption of the transistor(s).

15 Claims, 12 Drawing Sheets

U.S. PATENT DOCUMENTS

| | | | |
|---|---|---|---|
| 6,373,281 | B1 | 4/2002 | Chuang et al. |
| 6,429,726 | B1 | 8/2002 | Bruneau et al. |
| 6,448,840 | B2* | 9/2002 | Kao et al. .................. 327/534 |
| 6,469,572 | B1* | 10/2002 | Bruneau et al. ............ 327/537 |
| 6,476,372 | B2 | 11/2002 | Merrill et al. ........... 250/208.1 |
| 6,484,265 | B2 | 11/2002 | Borkar et al. |
| 6,525,559 | B1 | 2/2003 | Wu et al. |
| 6,529,421 | B1* | 3/2003 | Marr et al. ............ 365/189.09 |
| 6,535,034 | B1 | 3/2003 | Wong |
| 6,549,032 | B1 | 4/2003 | Shumarayev et al. |
| 6,590,440 | B1 | 7/2003 | Williams et al. |
| 6,597,203 | B2 | 7/2003 | Forbes ........................ 326/98 |
| 6,605,981 | B1 | 8/2003 | Bryant et al. |
| 6,614,688 | B2 | 9/2003 | Jeong et al. |
| 6,670,655 | B2 | 12/2003 | Lukes et al. |
| 6,731,158 | B1* | 5/2004 | Hass .......................... 327/537 |
| 6,744,301 | B1* | 6/2004 | Tschanz et al. ............. 327/534 |
| 6,777,978 | B2 | 8/2004 | Hart et al. |
| 6,784,722 | B2* | 8/2004 | Tang et al. .................. 327/534 |
| 6,972,599 | B2 | 12/2005 | Forbes ........................ 326/97 |
| 6,980,033 | B2 | 12/2005 | Forbes ........................ 326/96 |
| 7,098,689 | B1 | 8/2006 | Tuan et al. ................... 326/44 |
| 7,112,997 | B1 | 9/2006 | Liang et al. .................. 326/81 |
| 7,129,745 | B2 | 10/2006 | Lewis et al. |
| 2001/0012673 | A1 | 8/2001 | Gyu-chul |
| 2001/0047506 | A1 | 11/2001 | Houston |
| 2002/0005750 | A1 | 1/2002 | Kao et al. |
| 2002/0024378 | A1 | 2/2002 | Forbes et al. |
| 2002/0029352 | A1 | 3/2002 | Borkar et al. |
| 2002/0030533 | A1 | 3/2002 | De et al. |
| 2002/0031028 | A1 | 3/2002 | Forbes et al. |
| 2002/0033730 | A1 | 3/2002 | Yao et al. |
| 2002/0044076 | A1 | 4/2002 | Yao et al. |
| 2002/0079951 | A1 | 6/2002 | Borkar et al. |
| 2002/0118569 | A1 | 8/2002 | Jeong et al. |
| 2002/0140496 | A1 | 10/2002 | Keshavarzi et al. |
| 2002/0155671 | A1 | 10/2002 | Lukes et al. |
| 2002/0163377 | A1 | 11/2002 | Bruneau et al. |
| 2002/0171461 | A1 | 11/2002 | Yamazaki et al. |
| 2002/0171468 | A1 | 11/2002 | Bryant et al. |
| 2002/0179876 | A1 | 12/2002 | Pang et al. |
| 2003/0001658 | A1 | 1/2003 | Matsumoto |
| 2003/0001663 | A1 | 1/2003 | Zhang |
| 2003/0005378 | A1 | 1/2003 | Tschanz et al. |
| 2003/0016078 | A1 | 1/2003 | Hinterscher |
| 2003/0038668 | A1 | 2/2003 | Zhang et al. |
| 2003/0053335 | A1 | 3/2003 | Hart et al. |
| 2003/0067042 | A1 | 4/2003 | Kaatz |
| 2003/0067321 | A1* | 4/2003 | Turner ......................... 326/39 |
| 2003/0080802 | A1 | 5/2003 | Ono et al. |
| 2003/0141929 | A1 | 7/2003 | Casper et al. |
| 2003/0151428 | A1 | 8/2003 | Ou Yang |
| 2003/0209752 | A1 | 11/2003 | Cai et al. |
| 2003/0218478 | A1 | 11/2003 | Sani et al. ..................... 326/33 |
| 2004/0016977 | A1* | 1/2004 | Miyazaki et al. ............ 257/393 |
| 2004/0025135 | A1 | 2/2004 | Hart et al. |
| 2004/0123170 | A1 | 6/2004 | Tschanz et al. |
| 2005/0023633 | A1* | 2/2005 | Yeo et al. .................... 257/500 |
| 2005/0231274 | A1 | 10/2005 | Wu ............................. 327/558 |
| 2006/0038605 | A1 | 2/2006 | De Gyvez et al. |

OTHER PUBLICATIONS

Search Report, PCT/US2005/017265; 14 pgs.; copy enclosed; Date of Mailing Oct. 20, 2005.
U.S. Appl. No. 11/535,065, filed Sep. 26, 2006, Lewis et al.
U.S. Appl. No. 11/006,420, filed Sep. 26, 2006, Shumarayev et al.
U.S. Appl. No. 11/420,736, filed May 27, 2006, Shumarayev.
U.S. Appl. No. 11/420,737, filed May 27, 2006, Hoang et al.
U.S. Appl. No. 11/369,664, filed Mar. 6, 2006, Perisetty.
U.S. Appl. No. 11/369,654, filed Mar. 6, 2006, Perisetty.
U.S. Appl. No. 11/369,548, filed Mar. 6, 2006, Perisetty.
EP 07 00 3010 European Search report from European foreign counterpart to U.S. Appl. No. 11/369,664 (A2238), 2 pp., no date.
"Challenges For Low-Power And High-Performance Chips", IEEE Design & Test Of Computers, Jul.-Sep. 1998, pp. 119-124.
Kawaguchi et al., "Dynamic Leakage Cut-Off Scheme For Low-Voltage SRAM's", IEEE, Symposium On VLSI Circuits Digest Of Technical Papers, 1998, pp. 140-141.
Nose et al., "Voltage Dependent Gate Capacitance And Its Impact In Estimating Power And Delay Of CMOS Digital Circuits With Low Supply Voltage", ISLPED, 2000, pp. 228-230.
Zyuban et al., "Low Power Integrated Scan-Retention Mechanism", ISLPED, Aug. 12-14, 2002, pp. 98-102.
Das et al., "Ultra Low-Leakage Power Strategies For Sub-1 V VLSI:Novel Circuit Styles And Design Methodologies For Partially Depleted Silicon-On-Insulator (PD-SOI) CMOS Technology", 16th International Conference on VLSI Design, 2003, 6 pgs.
Yeap, "Leakage Current In Low Standby Power And High Performance Devices: Trends And Challenges", ISPD, Apr. 7-10, 2002, pp. 22-27.
Huang et al., "Scalability And Biasing Strategy For CMOS With Active Well Bias", Abstract Only, Symposium On VLSI Technology, 2001, 1 pg.
Kawaguchi et al., "FP 12.4: A CMOS Scheme For 0.5V Supply Voltage With Pico-Ampere Standby Current", IEEE, 1998, pp. 12.4-1 to 12.4-10.
Heo et al., "Dynamic Fine-Grain Leakage Reduction Using Leakage-Biased Bitlines", 29th Annual International Symposium For Computer Architecture (ISCA-29), May 2002, 11 pgs.
Kosonocky et al., "Enhanced Multi-Threshold (MTCMOS) Circuits Using Variable Well Bias", ISLPED, Aug. 6-7, 2001, pp. 165-169.
Kim et al., "Dynamic VTH Scaling Scheme For Active Leakage Power Reduction", Design, Automation And Test In Europe Conference And Exhibition, Mar. 2002, 5 pgs.
Tsai et al., "Reducing Leakage Energy In FPGAs Using Region-Constrained Placement", FPGA, Feb. 22-24, 2004, 8 pgs.
Chen et al., "Low-Power Technology Mapping For FPGA Architectures With Dual Supply Voltage", FPGA, Feb. 22-24, 2004, 9 pgs.
Li et al., "Low-Power FPGA Using Pre-defined Dual-Vdd/Dual-Vt Fabrics", FPGA, Feb. 22-24, 2004, 9 pgs.
Anderson et al., "Active Leakage Power Optimization For FPGAs", FPGA, Feb. 22-24, 2004, pp. 33-41.
Kosonocky et al., "Low-Power Circuits And Technology For Wireless Digital Systems", IBM J. Res. & Dev., vol. 47, No. 2/3, Mar./May 2003, pp. 283-298.
Sakurai, "Low Power Design Of Digital Circuits", pp. 1-5, no date.
Sakurai, "Recent Topics For Realizing Low-Power, High-Speed VLSIs", 6 pgs., no date.
Sakurai, "Recent Topics For Realizing Low-Power, High-Speed VLSIs", Workshop on Advanced CMOS, Oct. 31, 2001, 24 pgs.
Heo et al., "Leakage-Biased Domino Circuits For Dynamic Fine-Grain Leakage Reduction", Symposium On VLSI Circuits, Jun. 2002, 4 pgs.
Tschanz et al., "Dynamic Sleep Transistor And Body Bias For Active Leakage Power Control Of Microprocessors", IEEE Journal Of Solid-State Circuits, vol. 38, No. 11, Nov. 2003, pp. 1838-1845.
Miyazaki et al., "A 1.2-GIPS/W Microprocessor Using Speed-Adaptive Threshold-Voltage CMOS With Forward Bias", IEEE Journal Of Solid-State Circuits, vol. 37, No. 2, Feb. 2002, pp. 210-217.
Tschanz et al., "Adaptive Body Bias For Reducing Impacts Of Die-To-Die And Within-Die Parameter Variations On Microprocessor Frequency And Leakage", IEEE Journal Of Solid-State Circuits, vol. 37, No. 11, Nov. 2002, pp. 1396-1402.
Kuroda et al., "Variable Supply-Voltage Scheme For Low-Power High-Speed CMOS Digital Design", IEEE Journal Of Solid-State Circuits, vol. 33, No. 3, Mar. 1998, pp. 454-462.
Inukai et al., "Variable Threshold Voltage CMOS (VTCMOS) In Series Connected Circuits", ISPLED, Aug. 6-7, 2001, 7 pgs.
Sakurai et al., "Low-Power CMOS Design Through $V_{TH}$ Control And Low-Swing Circuits", 1997, pp. 1-6.

Kawaguchi et al., "A Reduced Clock-Swing Flip-Flop (RCSFF) For 63% Clock Power Reduction", Symposium on VLSI Circuits Digest Of Technical Papers, 1997, pp. 97-98.

Kuroda et al., "A 0.9-V, 150-MHz, 10-mW, 4mm$^2$, 2-D Discrete Cosine Transform Core Processor With Variable Threshold-Voltage (VT) Scheme", IEEE Journal Of Solid-State Circuits, vol. 31, No. 11, Nov. 1996, pp. 1770-1779.

Nose et al., "Optimization of $V_{DD}$ and $V_{Th}$ For Low-Power And High-Speed Applications", Proceedings ASP-DAC, 2000, 6 pgs.

Kawaguchi et al., "A Super Cut-Off CMOS (SCCMOS) Scheme For 0.5-V Supply Voltage With Picoampere Stand-By Current", IEEE Journal Of Solid-State Circuits, vol. 35, No. 10, Oct. 2000, pp. 1498-1501.

Nose et al., "$V_{TH}$-Hopping Scheme To Reduce Subthreshold Leakage For Low-Power Processors", IEEE Journal Of Solid-State Circuits, vol. 37, No. 3, Mar. 2002, pp. 413-419.

Nose et al., "$V_{TH}$-Hopping Scheme For 82% Power Saving In Low-Voltage Processors", IEEE, 2001, 4 pgs.

Kuroda et al., "Substrate Noise Influence On Circuit Performance In Variable Threshold-Voltage Scheme", ISLPED, 1996, 6 pgs.

Anderson et al., "A Novel Low-Power FPGA Routing Switch", IEEE Custom Integrated Circuits Conference, 2004, 4 pgs.

"Low-Power Programmable Routing Circuitry For FPGAs", 8 pgs., no date.

Inukai et al., "Variable Threshold Voltage CMOS In Series Connected Circuits", 29 pgs., no date.

Roy, "Leakage: Estimation And Circuit Design Technique For Nano-Scale Technologies", 103 pgs., no date.

Kuroda et al., "Overview Of Low-Power ULSI Circuit Technique", IEICE Trans. Electron., vol. E78-C, No. 4, Apr. 1995, 12 pgs.

Robenson, "Investigation Of A Dynamic Threshold Voltage Control Via Body Bulk-Biasing As A Forth Terminal On A CMOS Process Technology", University of Florida, Journal Of Undergraduate Research, http://web.clas.ufl.edu/CLAS/jur/0603/robensonpaper.html, Jun. 2003, 8 pgs.

Kobayashi et al, "Self-Adjusting Threshold-Voltage Scheme (SATS) For Low-Voltage High-Speed Operation", IEEE Custom Integrated Circuits Conference, May 1994, 5 pgs.

Burr et al, "A 200mV Self-Testing Encoder/Decoder Using Stanford Ultra-Low-Power CMOS", IEEE International Solid-State Circuits Conference, Digest Of Technical Papers, 1994, 3 pgs.

Hamada et al., "Utilizing Surplus Timing For Power Reduction", IEEE Custom Integrated Circuits Conference, 2001, pp. 89-92.

Kuroda, "Design With Multiple $V_{DD}$ Planes", ISSCC Workshop On Microprocessors, Feb. 2003, 36 pgs.

Kuroda, "CMOS Design Challenges To Power Wall", MNC, 2001, 58 pgs.

Martin et al, "Combined Dynamic Voltage Scaling And Adaptive Body Biasing For Lower Power Microprocessors Under Dynamic Workloads", ICCAD, Nov. 2002, 5 pgs.

Kuroda, "Optimization And Control For $V_{DD}$ And $V_{TH}$ For Low-Power, High-Speed CMOS Design", IEEE, 2002, 7 pgs.

Kuroda, "Low-Power, High-Speed CMOS VLSI Design, IEEE International Conference On Computer Design: VLSI In Computers And Processors", 2002, 6 pgs.

Najm, "State Dependence And Sleep States; Memory/Cache Circuits And Architectures", ICCAD, 2003, 67 pgs.

Anderson et al., "Low-Power Programmable Routing Circuitry For FPGAs", IEEE, 2004, 8 pgs.

Borkar et al., "Parameter Variations And Impact On Circuits And Microarchitecture", Circuit Research, Intel Labs, 14 pgs., no date.

Narendra et al., "Forward Body Bias For Microprocessors In 130-nm Technology Generation And Beyond", IEEE Journal Of Solid-States Circuits, vol. 38, No. 5, May 2003, pp. 696-701.

Augsburger et al, "Combining Dual-Supply, Dual-Threshold And Transistor Sizing For Power Reduction", 6 pgs., no date.

Kuroda, "Power-Aware Electronics: Challenges And Opportunities Unit 4: Design With Multiple $V_{DD}/V_{TH}$ Planes", FTFC Tutorial, May 14, 2003, 30 pgs.

Kuroda, paper in ISSCC 2002, 54 pages, no date.

Kuroda, "Power-Aware Electronics: Challenges And Opportunities Unit 5: Variable $V_{DD}/V_{TH}$ Design Techniques", FTFC Tutorial, May 14, 2003, 38 pages.

Kuroda, "10 Tips For Low Power CMOS Design", 40$^{th}$ DAC Tutorial 1 "Design Techniques For Power Reduction", Jun. 2, 2003, 72 pgs.

* cited by examiner

APPARATUS AND METHODS FOR ADJUSTING PERFORMANCE OF PROGRAMMABLE LOGIC DEVICES

TECHNICAL FIELD

The inventive concepts relate generally to adjusting the performance of programmable logic devices (PLDs) and, more particularly, to adjusting or setting the body bias of one or more devices in PLDs and, hence, configuring or adjusting the speed and/or the power consumption of the PLDs.

BACKGROUND

PLDs are ubiquitous electronic devices that provide flexibility to not only designers, but also end-users. During the design cycle of an electronic circuit or system, a designer may perform a relatively large number of design iterations by simply re-programming the PLD for each design. Thus, the length and expense of the design cycle decreases compared to other alternatives. Similarly, the end-user may have a desired level of control over the functionality of a design that includes PLD(s). By programming the PLD(s) in the field or even on a real-time basis, the user can change the way the circuit or system behaves.

To accommodate increasingly complex designs, modern PLDs include a relatively large number of transistors. Furthermore, users demand ever higher performance, which results in larger operating frequencies. Consequently, the power consumption, power dissipation, die temperatures and, hence, power density (power dissipation in various circuits or blocks), of PLDs has tended to increase. The upward march of the power density, however, may make PLDs design and implementation impractical or failure-prone. A need exists for PLDs that feature adjustable power consumption and performance.

SUMMARY

The disclosed inventive concepts relate to PLDs with adjustable or configurable power consumption and performance. In one embodiment, a PLD according to the invention includes a body-bias generator. The body-bias generator is configured to set the body bias of a transistor in the PLD. The body bias of the transistor may be set so as to trade off performance and power consumption of the transistor. (Of course, one may apply the technique to more than one transistor, as desired, and as described below in detail.)

In another embodiment, a PLD includes a control circuit, a body-bias generator, and a switch. The body-bias generator couples to the control circuit. The body-bias generator is configured to set a body bias of a transistor within the PLD. The switch also couples to the control circuit, and is configured to selectively shut down a circuit within the PLD.

In a third embodiment, a PLD includes a temperature sensor, a body-bias generator, and a control circuit. The temperature sensor is configured to sense the temperature of a circuit within the PLD. The body-bias generator sets the body bias of a set of transistors in response to a control signal. The control circuit couples to the temperature sensor and to the body-bias generator, and is configured to provide the control signal in response to a signal that it receives from the temperature sensor.

Another aspect of the inventive concepts concerns methods of configuring, operating, and using PLDs. In one embodiment, a method of configuring a PLD to implement an electronic circuit includes mapping the electronic circuit to functional resources within the PLD in order to generate a design to be implemented by the PLD. The method also includes identifying one or more critical circuit paths in the design to be implemented by the PLD, and programming the body-bias level of at least one transistor in the critical circuit path(s).

In another embodiment, a method of operating a PLD includes initially setting the body-bias level of at least one transistor in the PLD to a given level. The method also includes determining whether a performance measure of the PLD (e.g., speed, power consumption) meets a criterion, and adjusting the body-bias level of the at least one transistor, depending on whether the performance measure of the PLD meets the criterion.

In a third embodiment, a method of operating a PLD includes initially setting a body-bias level of at least one transistor in the PLD to a level. The method further includes determining whether a performance measure (e.g., speed, power consumption) and a temperature level of the PLD meet at least one criterion, and adjusting the body-bias level of the transistor(s), depending on whether the performance measure and the temperature level of the PLD meet the criterion.

In a fourth embodiment, a method of operating a PLD configured to function in a given or desired operating environment (e.g., a communication network) includes initially setting a body-bias level of at least one transistor in the PLD to a given level. The method also includes adjusting the body-bias level of the transistor(s) depending on at least one characteristic of the operating environment (e.g., the level of traffic within the communication network) of the PLD.

In yet another embodiment, one may adjust the body-bias level of the transistor(s) depending on at least one characteristic of the operating environment and a temperature level of the PLD. (For instance, in the communication network example, one may adjust the performance level of the PLD depending of the level of network traffic and the level of power dissipation levels within the PLD.)

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for PLDs that feature adjustable power and performance. The inventive concepts help to overcome excessive power density levels that conventional PLDs suffer. Moreover, one may adjust the performance level of a desired portion, or all, of a PLD according to the invention (i.e., on a granular basis ranging from individual transistors all the way to the entire PLD circuitry).

More specifically, and as described below in detail, the inventive concepts contemplate setting, programming, or adjusting the body or well bias of individual transistors, or groups of transistors, in a PLD. Adjusting the body bias varies the power consumption and performance of the transistor(s).

The inventive concepts provide the following benefits over traditional implementations. First, they allow trading off performance and power consumption or optimizing the performance-power consumption tradeoff. Second, one may selectively set, program, or adjust the body-bias level(s) in critical circuit paths or parts of the PLD so as to increase their performance as desired. Conversely, one may selectively set, program, or adjust the body-bias level(s) in non-critical circuit paths or parts of the PLD and therefore reduce their power consumption and lower their power densities.

In addition, one may shut down or disable unused parts or circuits within the PLD, thus reduce their power consumption and lower their power densities. One may also employ the inventive concepts to prevent (or reduce the probability of) thermal runaway. More specifically, in a traditional PLD, circuits operating at relatively high speeds tend to consume more power, resulting in temperature increase of the PLD. The increased power consumption may cause those circuits to consume more power. This positive feedback mechanism may increase the power densities to unsafe or destructive levels.

Figure 1:
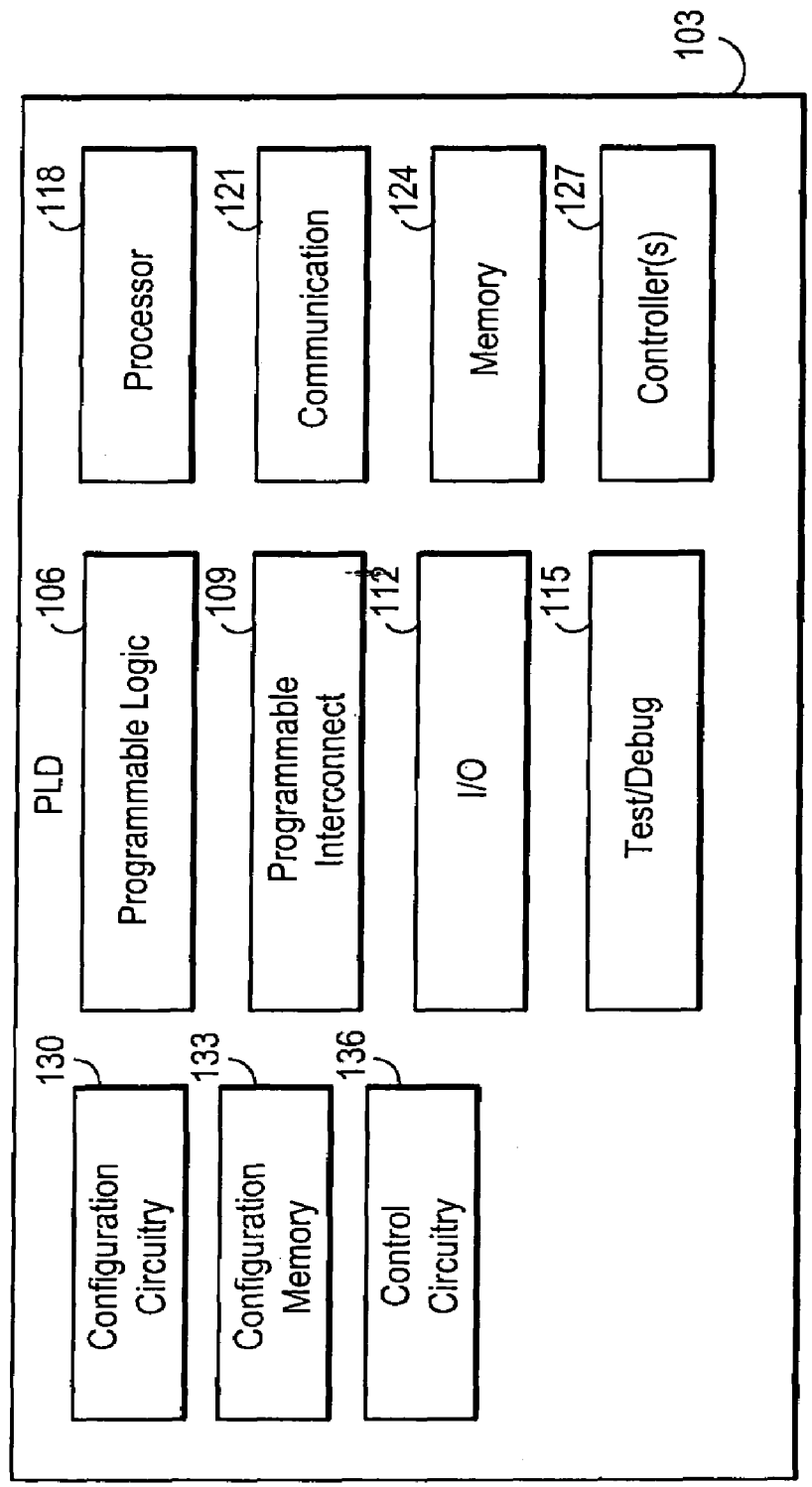
FIG. 1 shows a general block diagram of a PLD according to an illustrative embodiment of the invention.

FIG. 1 shows a general block diagram of a PLD 103 according to an illustrative embodiment of the invention. PLD 103 includes configuration circuitry 130, configuration memory 556, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers, logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. The configuration data determine the functionality of PLD 103 by programming programmable logic 106 and programmable interconnect 109, as persons skilled in the art with the benefit of the description of the invention understand.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

As noted above, PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuitry 121. Communication circuitry 121 may facilitate data and information exchange between various circuits within PLD 103 and circuits external to PLD 103, as persons of ordinary skill in the art who have the benefit of the description of the invention understand. As an example, communication circuitry 121 may provide various protocol functionality (e.g., Transmission Control Protocol/Internet Protocol (TCP/IP), User Datagram Protocol (UDP) etc.), as desired. As another example, communication circuitry 121 may include network (e.g., Ethernet, token ring, etc.) or bus interface circuitry, as desired.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

The blocks of circuitry within PLD 103 include a number of transistors. More particularly, the transistors constitute metal oxide semiconductor (MOS) transistors, such as N-type MOS (NMOS), P-type MOS (PMOS), complementary MOS (CMOS), or partially depleted silicon-on-insulator (SOI) MOS transistors (or a combination of those types of transistors), as desired.

Figure 2:
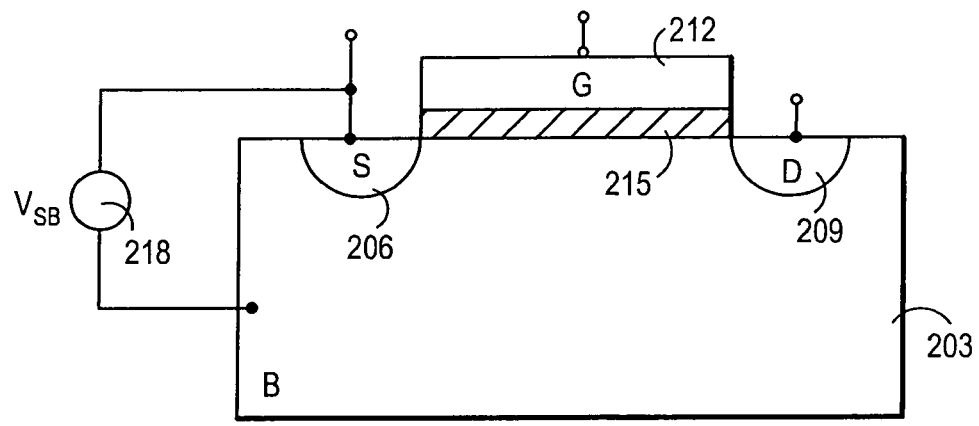
FIG. 2 illustrates a MOS transistor used in exemplary embodiments according to the invention.

FIG. 2 shows a MOS transistor used in exemplary embodiments according to the invention. The MOS transistor includes body (or substrate) region 203, source region 206, drain region 209, gate insulator 215, and gate 212. The drain current of the MOS transistor in the saturation region of operation depends on the threshold voltage and the gate-to-source voltage of the transistor:

$$i_D = K(v_{GS} - V_T)^2, \quad (1)$$

where $i_D$=the total drain current (i.e., including AC and DC components),

K=a constant, $v_{GS}$=the total gate-to-source voltage (i.e., including AC and DC components), and $V_T$=the threshold voltage.

The threshold voltage, $V_T$, depends on a number of factors, such as the voltage between source region 206 and body region 203 of the transistor. The following equation provides the threshold voltage as a function of the body-to-source voltage:

$$V_T = V_{T(o)} + \gamma\{\sqrt{2\phi_F - v_{BS}} - \sqrt{2\phi_F}\}. \quad (2A)$$

Alternatively, one may write Equation 2A in terms of the source-to-body voltage:

$$V_T = V_{T(o)} + \gamma\{\sqrt{2\phi_F + v_{SB}} - \sqrt{2\phi_F}\}, \quad (2B)$$

where $V_{T(o)}$=the threshold voltage with the source-to-body voltage (or body-to-source voltage) set to zero, $\gamma$=the body factor, a constant that depends on the doping levels of the body, $\phi_F$=a constant, $v_{BS}$=the total body-to-source voltage (i.e., including AC and DC components), and $v_{SB}$=the total source-to-body voltage (i.e., including AC and DC components). Note that when the body-to-source voltage, $v_{BS}$ (or source-to-body voltage, $v_{SB}$) equals zero, the threshold voltage, $V_T$, equals $V_{T(o)}$.

As Equation 2B shows, for a finite body factor, $\gamma$, the transistor's threshold voltage increases as the source-to-body voltage, $v_{SB}$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity ($v_{GS} - V_T$) and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability (one measure of performance) of the transistor. The decreased current-drive capability of the transistor in turn leads to slower circuit operation and, ultimately, to slower operation of the PLD that includes the transistor.

The power dissipation of the transistor also varies according to changes in its threshold voltage. More specifically, a smaller threshold voltage increases the OFF-state leakage current ($I_{off}$) of the transistor, and vice-versa. The $I_{off}$ of the transistor affects its static (non-switching) power dissipation. In addition, a smaller threshold voltage decreases the dynamic or switching power dissipation of the transistor. Thus, changing the threshold voltage by adjusting the body bias affects the power dissipation of the MOS transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor.

As the above description shows, one may affect the performance of the MOS transistor by adjusting its body bias and hence its source-to-body voltage (ultimately resulting in a chance in its threshold voltage). Adjusting the body bias affects performance measures such as current-drive capability, speed of operation, power dissipation, etc.

As noted above, in embodiments according to the invention, one may adjust the body bias of individual transistors, individual circuits or blocks within the PLD, groups of transistors or blocks, or even the entire PLD, as desired. Furthermore, one may control the body bias of individual NMOS and PMOS transistors, or the body biases of groups of NMOS and PMOS transistors, as desired. The following description provides the details.

Figure 3:
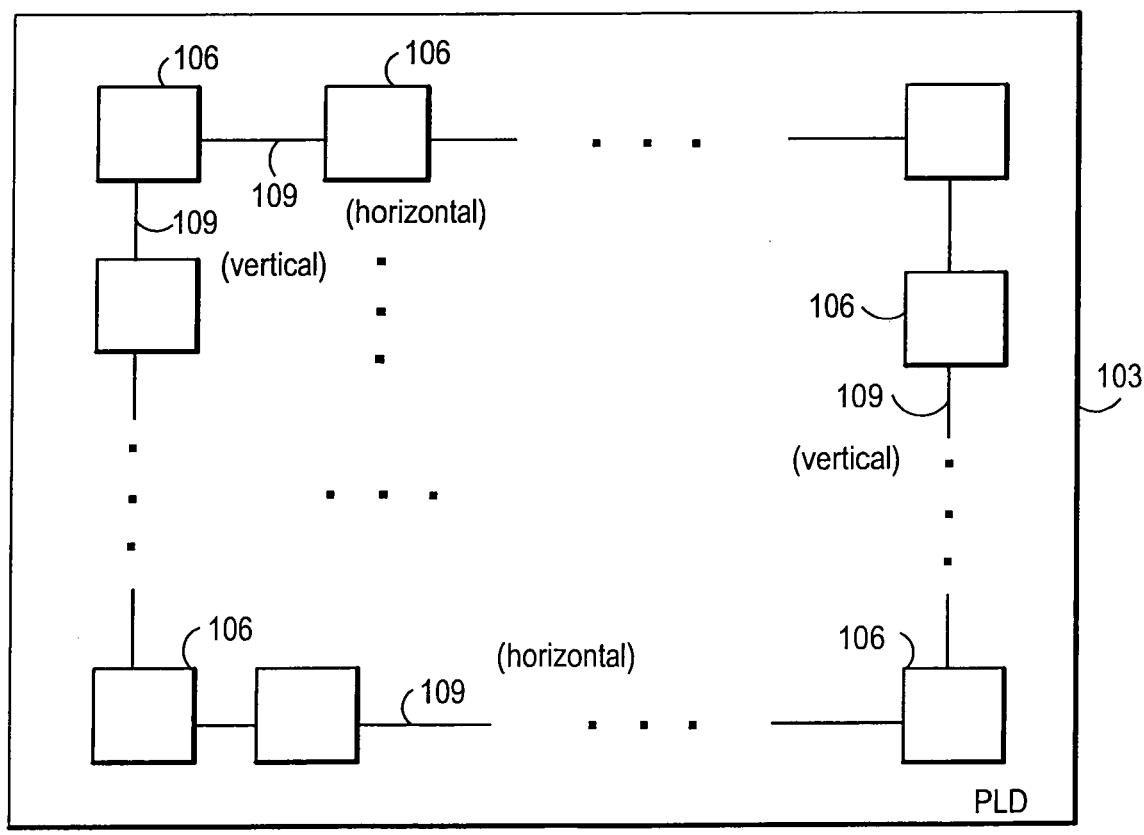
FIG. 3 depicts a floor-plan of a PLD according to an exemplary embodiment of the invention.

FIG. 3 shows a floor-plan of a PLD 103 according to an exemplary embodiment of the invention. PLD 103 includes programmable logic 106 arranged as a two-dimensional array. Programmable interconnect 109, arranged as horizontal interconnect and vertical interconnect, couples the blocks of programmable logic 106 to one another. One may adjust the body bias of each block of programmable logic 106, each segment of programmable interconnect 109, or both, as desired. Furthermore, one may adjust the body bias of a portion of one or more blocks of programmable logic 106, a portion of programmable interconnect 109, or both, as desired.

In illustrative embodiments, PLDs according to the invention have a hierarchical architecture. In other words, each block of programmable logic 106 in FIG. 3 may in turn include smaller or more granular programmable logic blocks or circuits. One may adjust the body bias of transistors in each level of the hierarchical architecture of the PLD, as desired.

Figure 4:
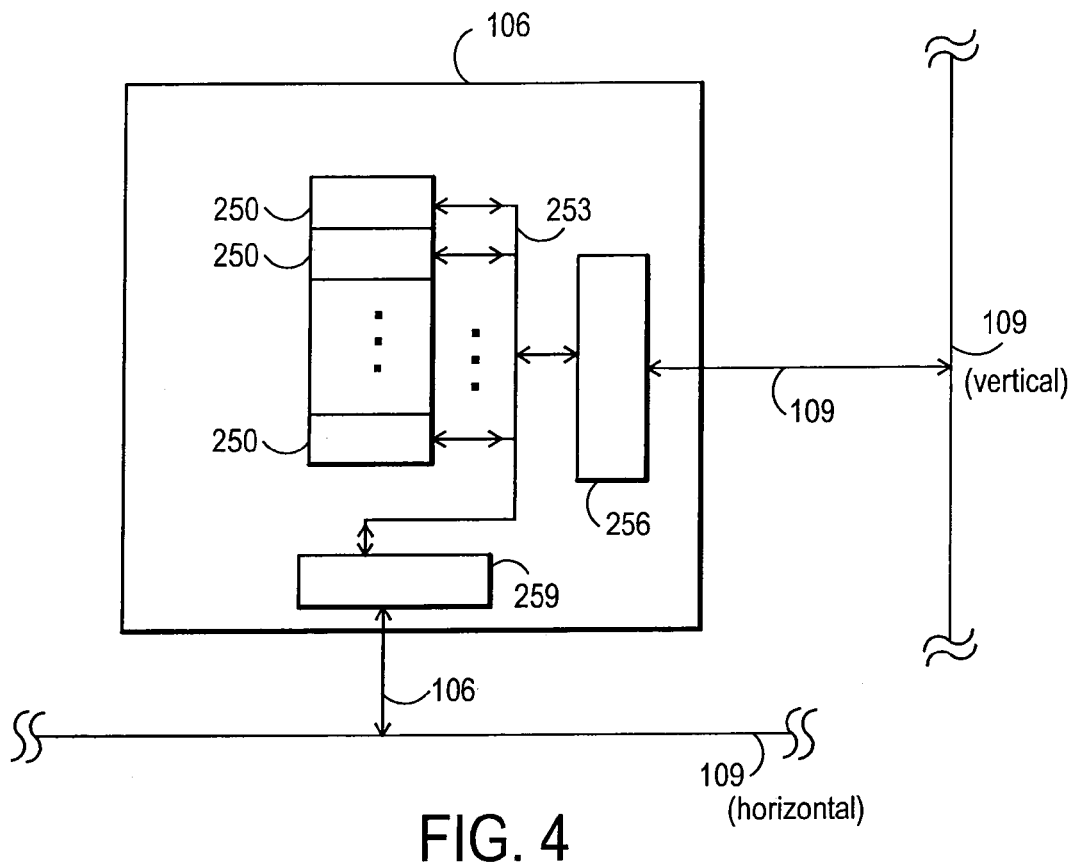
FIG. 4 shows a block diagram of a programmable logic in a PLD according to an exemplary embodiment of the invention.

FIG. 4 shows a block diagram of a programmable logic 106 in a PLD according to an exemplary embodiment of the invention. Programmable logic 106 includes logic elements or programmable logic circuits 250, local interconnect 253, interface circuit 256, and interface circuit 259. Logic elements 250 provide configurable or programmable logic functions, for example, LUTs, registers, product-term logic, etc., as persons of ordinary skill in the art who have the benefit of the description of the invention understand. Local interconnect 253 provides a configurable or programmable mechanism for logic elements 250 to couple to one another or to programmable interconnect 109 (sometimes called "global interconnect"), as desired.

Interface circuit 256 and interface circuit 259 provide a configurable or programmable way for programmable logic 106 block of circuitry to couple to programmable interconnect 109 (and hence to other programmable logic 106, as FIG. 3 shows). Interface circuit 256 and interface circuit 259 may include multiplexers (MUXs), registers, buffers, drivers, and the like, as persons of ordinary skill in the art who have the benefit of the description of the invention understand.

One may adjust the body bias of each portion or block of circuitry within PLD 103 (see FIGS. 1, 3, and 4), as desired. Furthermore, one may adjust the body bias of each portion or block of circuitry independently of others, on an individual or collective basis, as desired. Within each portion or block of circuitry, one may adjust the body bias of each sub-block or transistor, or groups of sub-blocks or transistors, on an individual or collective basis, as desired.

For example, one may adjust the body bias of all or a portion of the following circuitry within a PLD according to exemplary embodiments of the invention: one or more of the blocks in FIG. 1 (e.g., programmable logic 106, programmable interconnect 109, etc.); one or more logic elements 250 within one or more programmable logic blocks 106; one or more interface circuits 256 and/or 259, within one or more programmable logic blocks 106; one or more local interconnect within one or more programmable logic 106; and one or more MUXs, drivers, buffers, etc., within one or more interface circuits 256 and/or 259.

As noted above, one may make the body-bias adjustments in any desired level of granularity. In other words, one may make the adjustments applicable to individual transistors, groups of transistors, sub-blocks, blocks, or the entire PLD, as desired, and as applicable. For example, one may make body-bias adjustments to one or more NMOS transistors independently of one or more PMOS transistors, as desired.

Furthermore, one may adjust the body bias of one element in PLD 103 independently of all other elements, as desired. As persons of ordinary skill in the art with the benefit of the description of the invention understand, one may adjust the body bias some parts of a PLD and yet provide a fixed or default body bias for other parts of the PLD, as desired.

Figure 5:
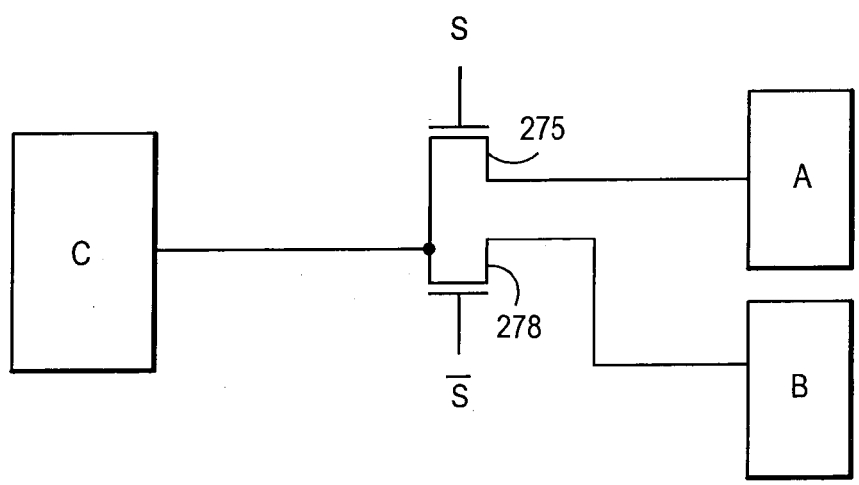
FIG. 5 illustrates a multiplexer used in PLDs according to exemplary embodiments of the invention that incorporate body-bias adjustment.

As an example of the granularity of body-bias adjustment, consider a two-input, one-output MUX. FIG. 5 shows a MUX used in PLDs according to exemplary embodiments of the invention that incorporate body-bias adjustment. The MUX includes transistor 275 and transistor 278. The MUX receives a signal from circuit A and another signal from circuit B. In response to a select signal, S, and its complement, S', the MUX routes to circuit C (coupled to the output of the MUX) either the signal from circuit A or the signal from circuit B.

One may adjust the body biases of transistor 275 and transistor 278 in a number of ways. First, one may choose to not adjust the body biases (e.g., use a default body bias within the PLD). Second, one may adjust the body bias of transistor 275 to the same level as the body bias of transistor 278. As an alternative, one may adjust the body bias of only of transistor 275 and transistor 278. As another choice, one may adjust individually the body biases of each of transistor 275 and transistor 278.

Thus, one may configure the performance properties of the MUX in a flexible manner. Put another way, one may balance or trade off the speed of operation, current-drive capability, and power dissipation of the MUX against one another. As further examples, note that one may extend the body-bias adjustment concept to a set of transistors in a MUX, to a particular signal route (e.g., a signal routing corresponding to a particular input), to a set of pass transistors (for example, a set of pass transistors in programmable routing, which feed a MUX shared by other sets of pass transistors to save configuration memory bit counts), etc.

Figure 6:
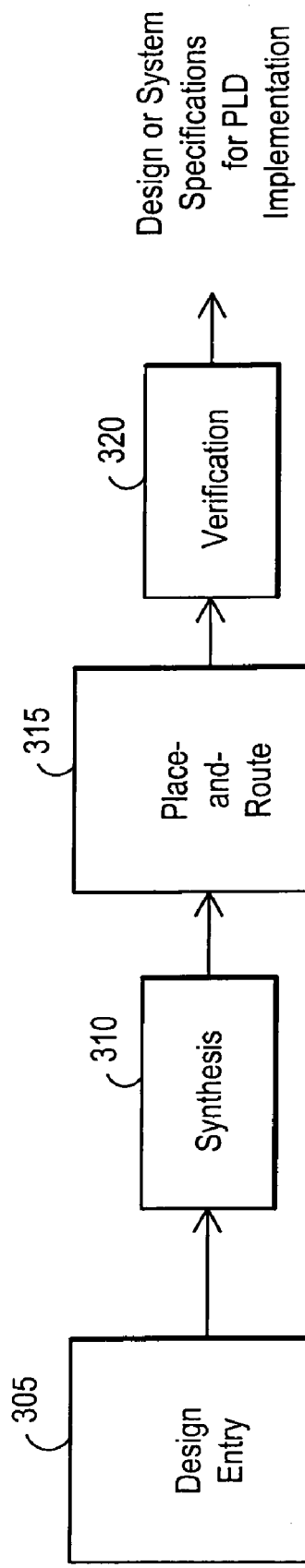
FIG. 6 depicts various software modules that PLD computer-aided design (CAD) software according to illustrative embodiments of the invention uses.

As noted above, the user may adjust the body bias of various portions of PLDs according to the invention. The user may do so by using the software used to map a design to a PLD. FIG. 6 depicts various software modules that PLD computer-aided design (CAD) software according to illustrative embodiments of the invention uses. The modules include design-entry module 305, synthesis module 310, place-and-route module 315, and verification module 320.

Design-entry module 305 allows the integration of multiple design files. The user may generate the design files by using design-entry module 305 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Design importer and interface generator 136 allows the user to import designs and to generate desired interfaces to those designs. Design importer and interface generator 136 may at least in part reside within design-entry module 305. Because design importer and interface generator 136 operates on some outputs of design-entry module 305 (for example, to generate appropriate interfaces), design importer and interface generator may constitute a separate block or module from design-entry module 305, as desired.

Synthesis module 310 accepts the output of design-entry module 305. Based on the user-provided design, synthesis module 310 generates appropriate logic circuitry that realizes the user-provided design. One or more PLDs (not shown explicitly) implement the synthesized overall design or system. Synthesis module 310 may also generate any glue logic that allows integration and proper operation and interfacing of various modules in the user's designs. For example, synthesis module 310 provides appropriate hardware so that an output of one block properly interfaces with an input of another block. Synthesis module 310 may provide appropriate hardware so as to meet the specifications of each of the modules in the overall design or system.

Furthermore, synthesis module 310 may include algorithms and routines for optimizing the synthesized design. Through optimization, synthesis module 310 seeks to more efficiently use the resources of the one or more PLDs that implement the overall design or system. Synthesis module 310 provides its output to place-and-route module 315.

Place-and-route module 315 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 315 helps optimize the performance of the overall design or system. By proper use of PLD routing resources, place-and-route module 315 helps to meet the critical timing paths of the overall design or system. Place-and-route module 315 optimizes the critical timing paths to help provides timing closure faster in a manner known to persons of ordinary skill in the art with the benefit of the description of the invention. As a result, the overall design or system can achieve faster performance (i.e., operate at a higher clock rate or have higher throughput).

Furthermore, place-and-route module 315 adjusts the body bias of a portion of or all of the PLD(s) that implement the design or system. Place-and-route module 315 may do so automatically, according to user-specified criteria, or a combination of the two. Place-and-route module 315 may use the user-specified criteria (for example, performance specifications, such as power dissipation, speed, and/or current-drive capability). In addition, or instead, place-and-route module 315 may use the information about critical paths within the design or system to adjust body biases of parts or all of the design or system, as desired.

For example, place-and-route module 315 may adjust the body biases of the critical parts of the design or system so as to achieve higher performance. Place-and-route module 315 may take into account power dissipation criteria (e.g., maximum power density) so as to trade off power and performance, as desired. Place-and-route module 315 provides the optimized design to verification module 320.

Verification module 320 performs simulation and verification of the design. The simulation and verification seek in part to verify that the design complies with the user's prescribed specifications. The simulation and verification also aim at detecting and correcting any design problems before prototyping the design. Thus, verification module 320 helps the user to reduce the overall cost and time-to-market of the overall design or system.

Verification module 320 may support and perform a variety of verification and simulation options, as desired. The options may include design-rule checking, functional verification, test-bench generation, static timing analysis, timing simulation, hardware/software simulation, in-system verification, board-level timing analysis, signal integrity analysis and electromagnetic compatibility (EMC), formal netlist verification, and power-consumption estimation, as desired. Note that one may perform other or additional verification techniques as desired and as persons of ordinary skill in the art who have the benefit of the description of the invention understand.

Figure 7:
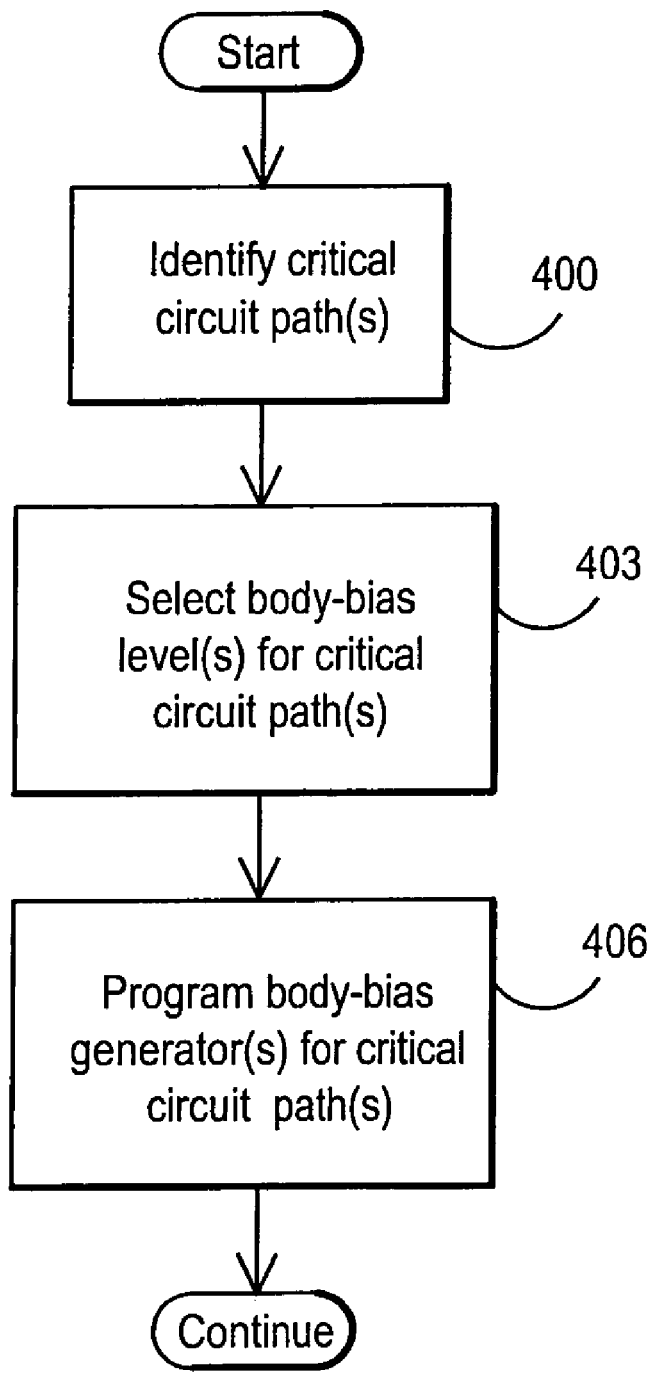
FIG. 7 shows a flow diagram for the process of adjusting body bias according to an exemplary embodiment of the invention.

FIG. 7 shows a flow diagram for the process of adjusting body bias according to an exemplary embodiment of the invention. A program, such as the software described in conjunction with FIG. 6, may perform the process in FIG. 7.

Once the process begins, at 403, it identifies critical circuit path(s) within the PLD that implements the design or system, as described above, and as persons of ordinary skill in the art who have the benefit of the description of the invention understand. At 403, the process adjusts the body bias of transistors within the identified critical circuit path(s). In other words, it select one or more body-bias levels for one or more transistor or sets of transistors. Next, at 406, the process programs or configures one or more body-bias generators for the critical circuit path(s). The body-bias generator(s) generate one or more body-bias levels selected at 403.

Note that the process need not confine itself to merely the identified critical circuit paths or blocks. Instead, or in addition, the user may identify and specify circuit paths or blocks that the user desired to meet specific performance criteria. For example, the user may wish to have a high-speed adder implemented within the PLD. The user may identify the circuitry or blocks used to implement the adder and specify to the software to adjust the body-bias level(s) of the circuitry or blocks to meet certain timing specifications. The user may provide other performance specifications or criteria, such as power dissipation. The software may trade off the various performance specifications to select the body-bias level(s) of the circuit path(s) or blocks.

Figure 8:
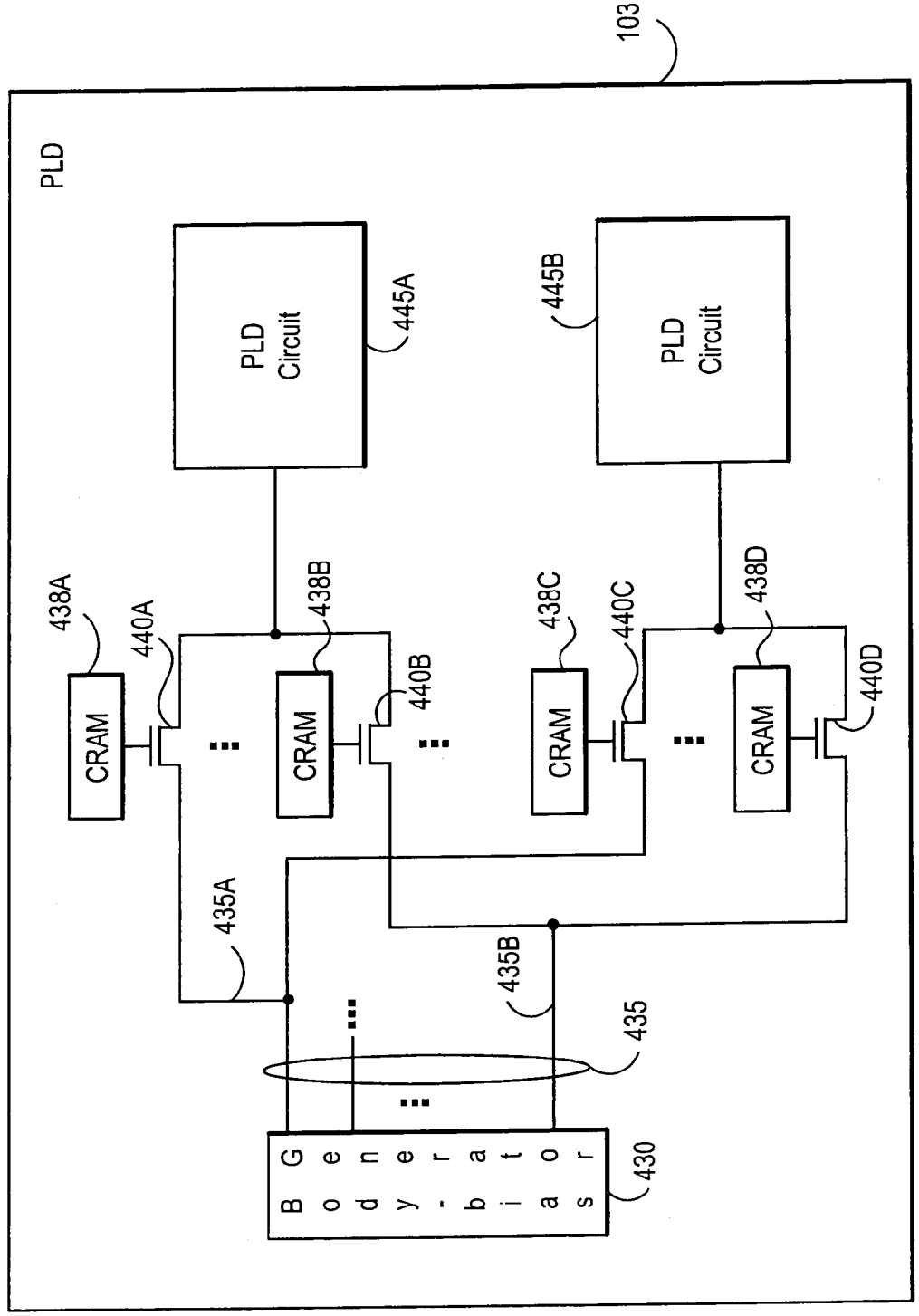
FIG. 8 illustrates a block diagram of circuitry within a PLD according to exemplary embodiments of the invention to adjust, program, or set the body-bias levels of desired PLD circuitry or blocks.

FIG. 8 shows a block diagram of circuitry within a PLD according to exemplary embodiments of the invention to adjust, program, or set the body-bias levels of desired PLD circuitry or blocks. The circuitry includes body-bias generator 430, a plurality of configuration memory (configuration random-access memory, or CRAM, or other implementations of the memory) cells 438A-438D, a plurality of transistors 440A-440D, and PLD circuits 445A-445B.

Body-bias generator 430 generates one or more body-bias signals 435 and provides those signal(s) to transistors 440A-440D. In response to a respective one of the data in CRAM cells 438A-438, transistors 440A-440D provide the body-bias signals 435 to PLD circuits 445A-445B. PLD circuits 445A-445B may constitute circuitry whose body-bias levels one wishes to set, program, or adjust, such as individual transistors, groups of transistors, circuit blocks, etc., as described above.

For example, suppose that CRAM cells 438A and 438C store binary ones, whereas CRAM cells 438B and 438D store binary zeros. Consequently, transistors 440A and 440C turn ON and provide body-bias signal 435A to PLD circuits 445A-445B. Transistors 440B and 440D turn OFF, and therefore do not provide any signals to PLD circuits 445A-445B.

As another example, suppose that the reverse situation of the preceding example exists (i.e., CRAM cells 438A-438D hold binary data 0, 1, 0, 1, respectively). In this case, transistors 440A and 440C turn OFF (and thus provide no signals to PLD circuits 445A-445B), and transistors 440B and 440D turn ON. As a result, transistors 440B and 440D provide body-bias signal 435B to PLD circuits 445A-445D.

In exemplary embodiments, CRAM cells 438A-438D may serve more than one purpose, as desired. More specifically, CRAM cells 438A-438D may control the body bias of various circuitry within the PLD (e.g., PLD circuit 445A or 445B). In addition, CRAM cells 438A-438D may serve as routing CRAM cells. In other words, in addition to controlling body bias levels, one or more of CRAM cells 438A-438D may select one circuit path over another circuit path within a MUX (i.e., select one routing path within a MUX as opposed to an alternative routing path within the MUX), as desired.

Note that one may implement body-bias generator 430 in a variety of ways, as persons of ordinary skill in the art with the benefit of the description of the invention understand. For example, one may use a bias source (e.g., one of a variety of well-known bias sources) and then use a charge pump to generate body-bias signals 435, which are pumped to appropriate or desired levels. As another example, one may use stored digital data corresponding to body-bias levels and use one or more scaler circuits together with one or more digital-to-analog converters (DACs) to generate the desired body-bias signals 435.

In addition to adjusting, programming, or setting body-bias levels, one may use other measures to control the power dissipation and, hence, power density of PLDs. More specifically, one may selectively shut down or turn off portion(s) of the circuitry within a PLD. As a result, one may further reduce the power dissipation within the PLD.

Figure 9:
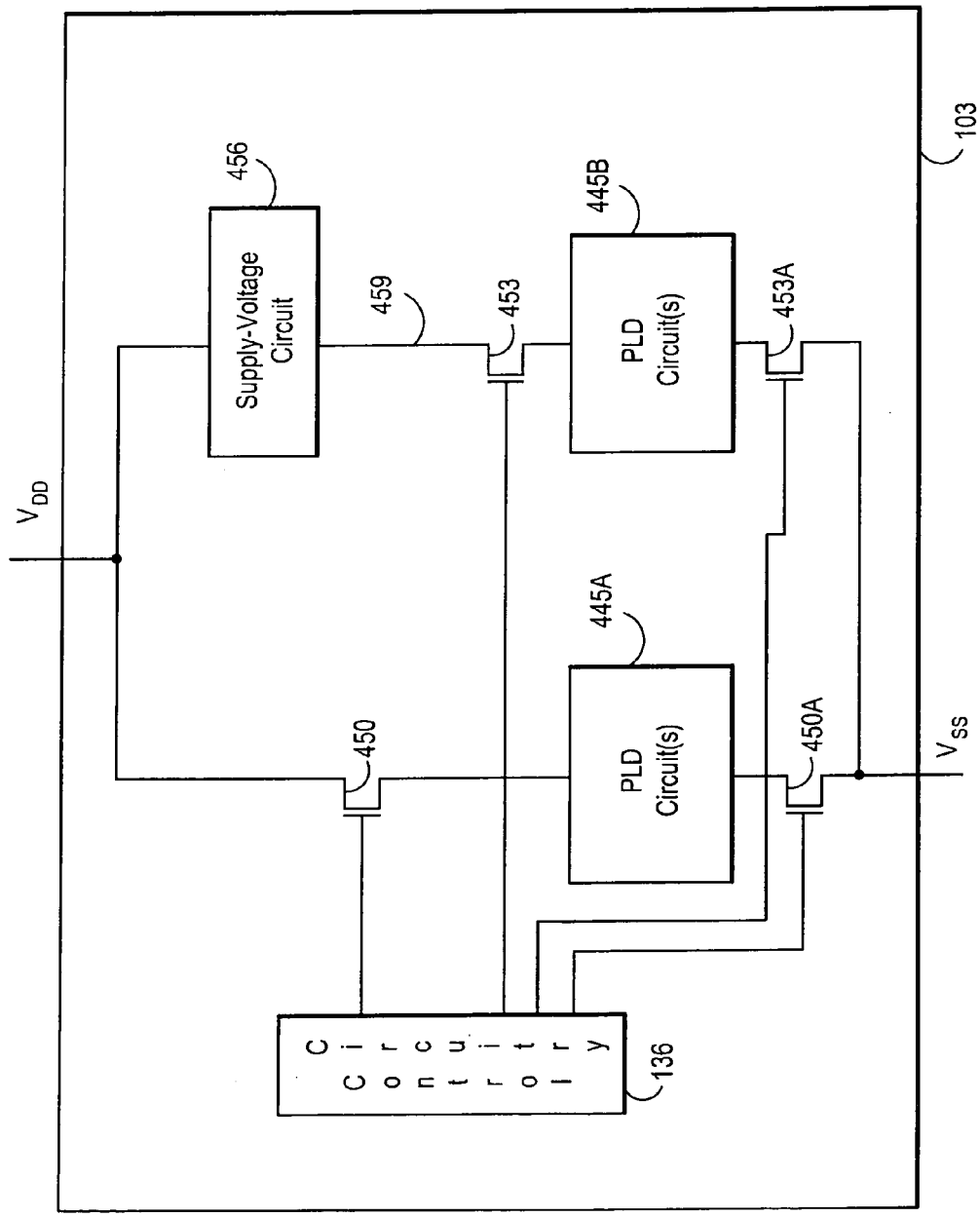
FIG. 9 depicts a block diagram of a circuit for selectively turning off circuitry or reducing or generally controlling power consumption of circuitry within a PLD according to exemplary embodiments of the invention.

FIG. 9 shows a block diagram of a circuit for selectively turning off circuitry or reducing or generally controlling power consumption of circuitry within a PLD according to exemplary embodiments of the invention. The circuit includes control circuitry 136, transistor 450, and PLD circuit(s) 445A. In addition, the circuit may include transistor 450A, transistor 453, supply-voltage circuit 456, transistor 453A, and PLD circuit(s) 445B.

Suppose that one wishes to shut down PLD circuit(s) 445A. Transistor 450 couples PLD circuit 445A to the supply voltage $V_{DD}$. In other words, when transistor 450 is ON, PLD circuit(s) 445A receive(s) the supply voltage $V_{DD}$, and vice-versa. Transistor 450 turns ON and OFF in response to a control signal from control circuitry 136. Thus, to turn off PLD circuit(s) 445A, one causes control circuitry 136 to de-assert the gate signal of transistor 450 and interrupt the supply voltage to PLD circuit(s) 445A. One may subsequently turn ON PLD circuit(s) 445A by asserting the gate signal of transistor 450 under the supervision of control circuitry 136.

Note that, rather than turning transistor 450 OFF or ON, one may control the gate voltage of transistor 450 so as to use transistor 450 as a variable impedance device. Thus, transistor 450 may at extremes have relatively high impedance (OFF state), relatively low impedance (ON state), or an impedance level between those two states. As a result, one may not only turn OFF and ON PLD circuit(s) 445A, but also control power dissipation within those circuit(s) by controlling the impedance of transistor 450.

In addition to, or instead of, using transistor 450 to control the provision of supply voltage, $V_{DD}$, to PLD circuit(s) 445A (whether turning OFF, ON, or anything in between those extremes, as described above), one may use transistor 450A to control the provision of supply voltage $V_{SS}$ (typically circuit ground). The details of operation are similar to those described above with respect to transistor 450 and supply voltage $V_{DD}$, as persons of ordinary skill in the art who have the benefit of the description of the invention understand.

PLD 103 may use more than one supply voltage, as desired. In other words, one may optionally use supply-voltage circuit 456 to generate secondary supply-voltage 459 from the primary supply voltage, $V_{DD}$. Secondary supply-voltage 459 may have a smaller or larger magnitude than the primary supply voltage, as desired. Furthermore, one may use more than one secondary supply-voltage, as desired. Secondary supply-voltage 445B powers PLD circuit 445B. One may shut down or power up PLD circuit(s) 445B by, respectively, de-asserting and asserting the gate signal of transistor 453 under the supervision of control circuitry 136.

Note that, rather than turning transistor 453 OFF or ON, one may control the gate voltage of transistor 453 so as to use it as a variable impedance device. Thus, transistor 453 may at extremes have relatively high impedance (OFF state), relatively low impedance (ON state), or an impedance level between those two states. As a result, one may not only turn OFF and ON PLD circuit(s) 445B, but also control power dissipation within those circuit(s) by controlling the impedance of transistor 453.

In addition to, or instead of, using transistor 453 to control the provision of secondary supply voltage 459 to PLD circuit(s) 445B (whether turning OFF, ON, or anything in between those extremes, as described above), one may use transistor 453A to control the provision of supply voltage $V_{SS}$ (typically circuit ground). The details of operation are similar to those described above with respect to transistor 453 and secondary supply-voltage 459, as persons of ordinary skill in the art who have the benefit of the description of the invention understand.

Note that each PLD circuit 445A and/or PLD circuit 445B may constitute a PLD block (see, for example, FIGS. 1, 3, and 4), a portion of a PLD block, or a set of PLD blocks, as desired. In other words, one may selectively apply the power control techniques to one or more blocks, sub-blocks, or portions of block(s) within a PLD, as desired.

Figure 10:
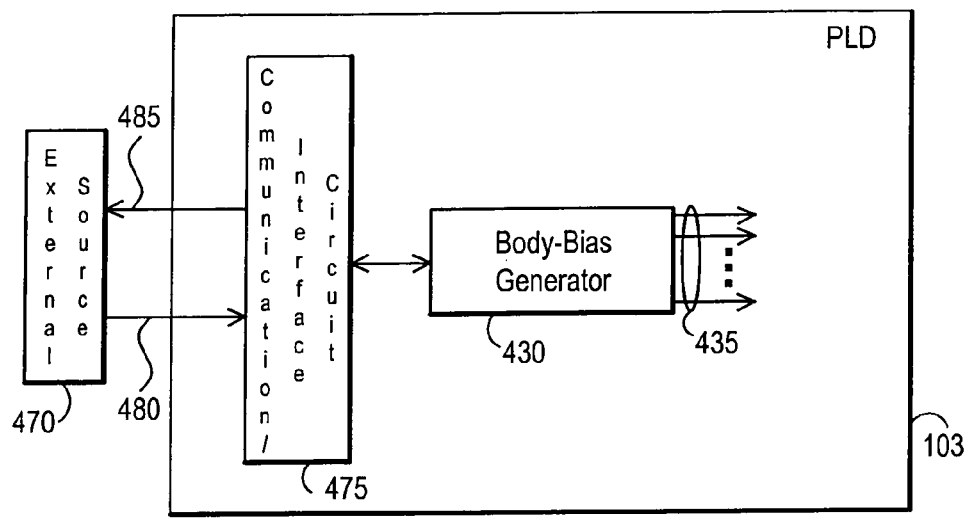
FIG. 10 shows a circuit arrangement according to exemplary embodiments of the invention for adjusting body-bias levels within a PLD in response to an external source.

Note that one may adjust, program, or set body-bias levels in response to sources external to the PLD. For example, one may communicate body-bias levels to a PLD to adjust or modify its performance. FIG. 10 shows a circuit arrangement according to exemplary embodiments of the invention for adjusting body-bias levels within a PLD in response to an external source 470. The circuit arrangement includes external source 470, communication/interface circuit 475, and body-bias generator 430.

Communication/interface circuit 475 provides a mechanism for external source 470 and body-bias generator 430 to communicate and exchange information. External source 470 may provide one or more control signal(s) 480 to communication/interface circuit 475 within PLD 103. Communication/interface circuit 475 provides the information received from external source 470 to body-bias generator 430. In response, body-bias generator 430 generates one or more body-bias signals 435, with levels corresponding to control signal(s) 480. Communication/interface circuit 475 may provide information, such as status signals, from body-bias generator 430 (or PLD 103 generally) to external source 470.

External source 470 may constitute a variety of devices, structures, or arrangements, as persons of ordinary skill in the art with the benefit of the description of the invention understand. For example, external source 470 may constitute the Internet, a computer network, a bus, etc., as desired.

Note that one may adjust, program, or set the body-bias levels in PLDs on a dynamic or time-varying basis, as desired, to take into account or respond to changing conditions (for example, changes in performance specifications). As one example, referring to FIG. 10, external source 470 may update or modify control signal(s) 480 that it provides to PLD 103. In response, body-bias generator 430 provides body-bias signals 435 that correspond to the updated or modified control signal(s) 480.

Figure 11:
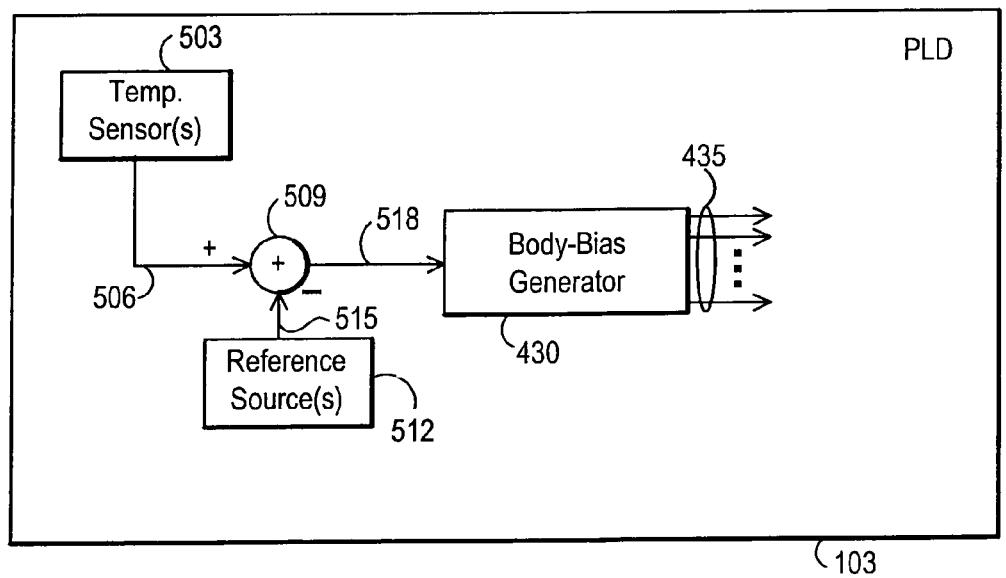
FIG. 11 illustrates a circuit arrangement for modifying body-bias level(s) within a PLD according to exemplary embodiments of the invention.

As another example, one may change or adjust body-bias levels in response to changes within PLD 103 itself, for instance, a change in temperature in one or more circuits or areas of PLD 103. FIG. 11 shows a circuit arrangement for modifying body-bias level(s) within a PLD according to exemplary embodiments of the invention.

The circuit arrangement includes one or more temperature sensor(s) 503, one or more reference source(s) 512, subtracter 509, and body-bias generator 430. Temperature sensor(s) 503 sense the temperature in one or more areas, circuits, or blocks within PLD 103 and provide temperature signal(s) 506 to subtracter 509. Reference source(s) 512 provide reference signal(s) 515 to subtracter 509. Reference signal(s) 515 may have values that correspond to various temperature levels.

Subtracter 509 subtracts reference signal(s) 515 from temperature signal(s) 506 and provides difference signal(s) 518 to body-bias generator 430. Difference signal(s) 518 may constitute the difference between actual temperatures and desired temperatures in one or more parts of PLD 103.

In response to difference signal(s) 518, body-bias generator 430 generates body-bias signal(s) 435. Body-bias generator 430 may use difference signal(s) 518 to generate body-bias signal(s) 435 that affect various aspects of the performance of PLD 103. For example, if difference signal(s) 518 indicate a lower temperate than a threshold or maximum temperature, body-bias generator 430 may generate body-bias signal(s) that decrease the threshold voltage of one or more transistors within PLD 103 (and hence cause increased performance). In contrast, if difference signal(s) 518 indicate a temperature level higher than a safe or maximum level, body-bias generator 430 may generate body-bias signal(s) that increase the threshold voltage of one or more transistors within PLD 103 (thus causing decreased temperature levels, albeit decreased performance).

More generally, one may implement a feedback loop that generates body-bias level(s) so as to target specific performance criteria. Put another way, one may compare actual performance measures of a PLD to desired or specified measures or criteria and adjust, program, or set body-bias levels accordingly.

Figure 12:
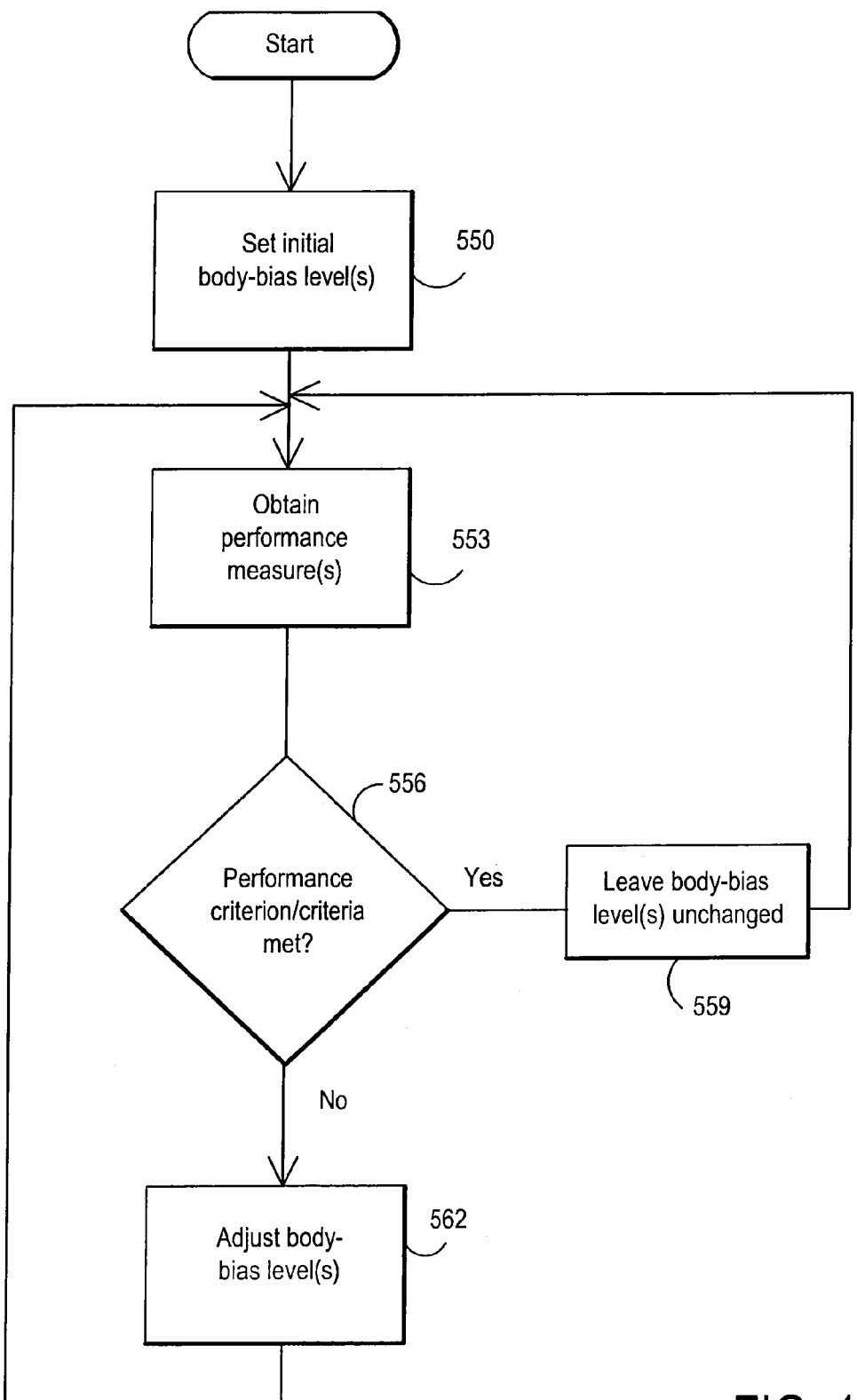
FIG. 12 depicts a flow diagram for a process or technique of adjusting, programming, or setting body-bias levels in a PLD used in exemplary embodiments of the invention.

FIG. 12 shows a flow diagram for a process or technique of adjusting, programming, or setting body-bias levels in a PLD used in exemplary embodiments of the invention. One may implement the process or technique by using appropriate circuitry (or a combination of circuitry and software or firmware), such as control circuitry 136.

The process operates as follows. At 550, one sets or programs initial body-bias level(s) for desired portion or portions of the PLD. Subsequently, at 553, one obtains performance measure(s) of the PLD. The performance measures may include a wide variety of criteria, such as the time a given operation takes, power consumption, power density, throughput, on-chip self test results, and the like, as persons of ordinary skill in the art who have the benefit of the description of the invention understand.

Next, at 556, the process checks to determine whether the actual performance measure(s) meet the desired or specified criterion or criteria. If so, at 559, the process leaves the body-bias level(s) unchanged. On the other hand, if the actual performance measure(s) fail to meet the specified criterion or criteria, at 562 the process adjusts, programs, or sets new or updated body-bias levels so as to reduce the difference between the actual and desired performance measure(s). The process then returns to 553 to check whether the effect of the new body-bias level(s) on the actual performance measure(s). The process may continue indefinitely or a given number of times, as desired.

Figure 13:
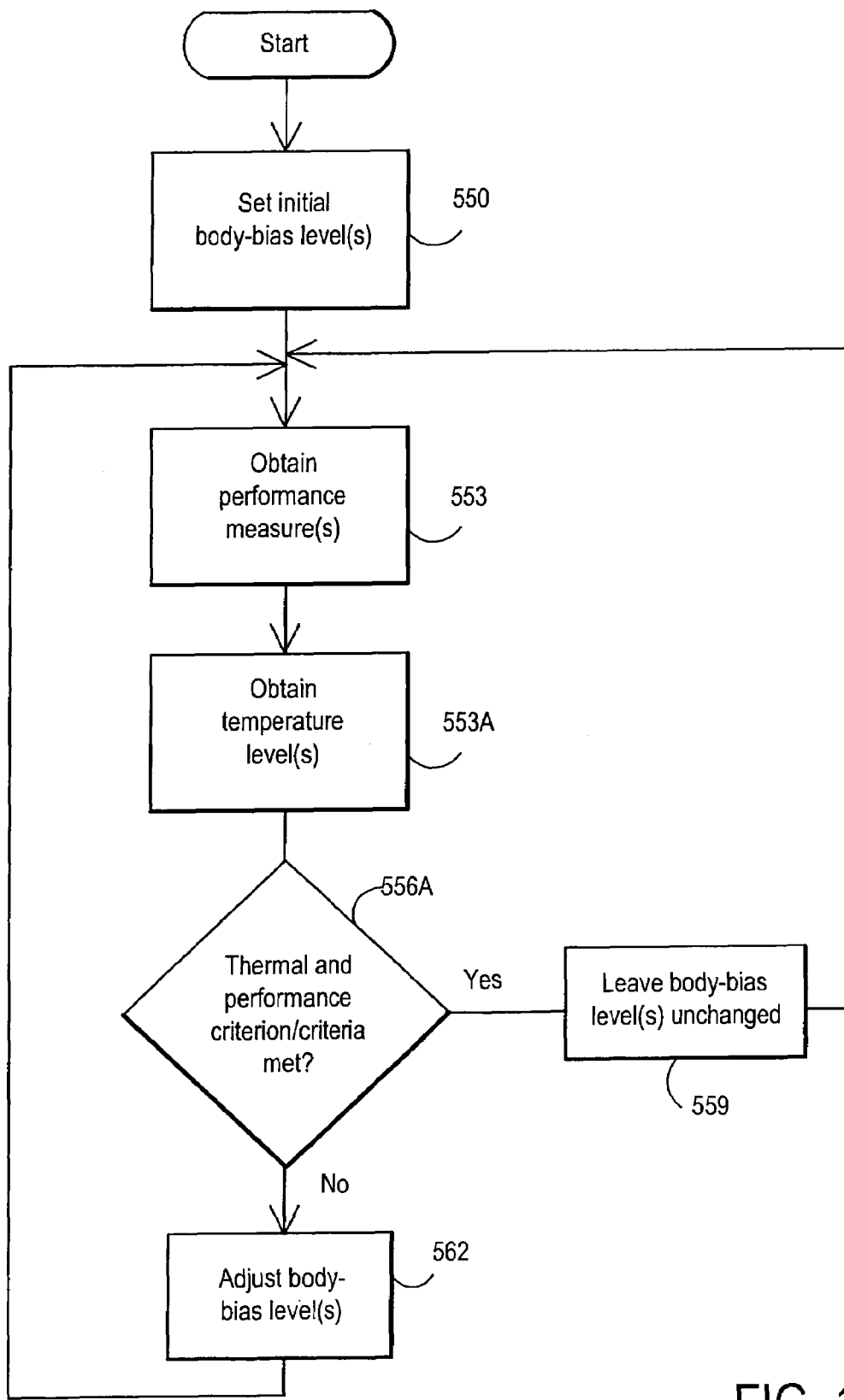
FIG. 13 shows a flow diagram for a process or technique of adjusting, programming, or setting body-bias level(s) that takes temperature level(s) into account.

In addition to checking performance measures (e.g., speed of operation, throughput, power consumption), one may check temperature level(s) of one or more parts or circuits within the PLD. FIG. 13 shows a flow diagram for a process or technique of adjusting, programming, or setting body-bias level(s) that takes temperature level(s) into account. As noted above, one may implement the process or technique by using appropriate circuitry (or a combination of circuitry and software or firmware), such as control circuitry 136.

At 550, the process sets, programs, or adjusts the initial body-bias level(s) for desired transistors, circuits, blocks, and the like, within the PLD. At 553, it obtains performance measures. The performance measures may include a wide variety of parameters or variables, as noted above. The choice of performance measures depends on factors such as design and performance specifications for the circuit or system that the PLD implements, as persons of ordinary skill in the art understand.

Subsequently, a 553A, the process obtains temperature level(s). As noted above, one may obtain and check one ore more temperature levels from various parts of the PLD. In exemplary embodiments, one may obtain temperature level(s) from any identified critical path(s) or, in general, any circuitry that may have relatively high power consumption and, hence, relatively high temperature levels.

At 556A, the process checks to determine whether the actual performance measure(s) meet the desired or specified criterion or criteria. Furthermore, the process checks to determine whether the actual temperature level(s) meet the desired or specified criterion or criteria (e.g., whether the actual temperature falls within a prescribed range or below a threshold level, etc.).

If both conditions hold, at 559, the process leaves the body-bias level(s) unchanged. If both conditions fail to hold, however, at 562 the process adjusts, programs, or sets new or updated body-bias levels so as to reduce the difference between the actual and desired performance measure(s) and between the actual and desired or prescribed temperature level(s). The process then returns to 553 to check whether the effect of the new body-bias level(s) on the actual performance measure(s) and on the temperature level(s). The process may continue indefinitely or a given number of times, as desired.

In other embodiments, one may adjust, program, or set the body-bias level(s) in response to or depending on the operating environment of the circuit or system that the PLD implements. For example, suppose that one uses a PLD according to the invention to realize a communications network controller or router. During operation, the PLD may obtain information about the conditions or characteristics of the environment in which the controller or router operates.

For instance, the PLD may obtain measures relating to the traffic levels within that environment. Depending on the conditions in, or characteristics of, its operating environment, the PLD may adjust, program, or set body-bias level(s) in one or more of its transistors so that its performance matches the needs of the operating environment. Of course, the example above constitutes merely one illustration of how one may use such PLDs. One may apply the inventive concepts to a wide variety of circuits, systems, and operating environments, each with their own characteristics and conditions, as persons of ordinary skill in the art who have the benefit of the description of the invention understand.

Figure 14:
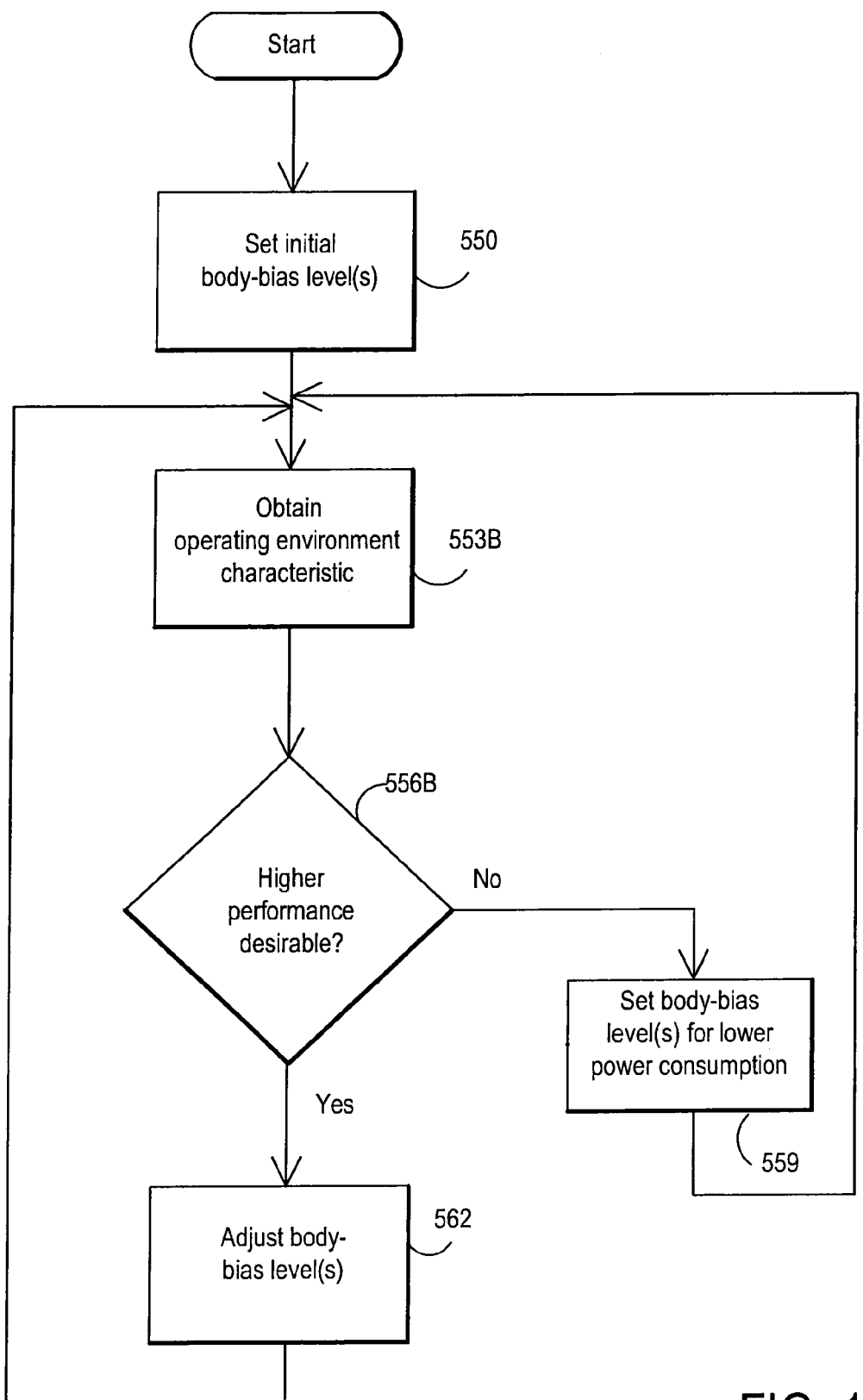
FIG. 14 illustrates a flow diagram for a process or technique of adjusting, programming, or setting body-bias level(s) that takes into account the characteristics of the environment in which the PLD operates.

FIG. 14 shows a flow diagram for a process or technique of adjusting, programming, or setting body-bias level(s) that takes into account the characteristics or conditions of the environment in which the PLD operates. As noted above, one may implement the process or technique by using appropriate circuitry (or a combination of circuitry and software or firmware), such as control circuitry 136.

The process operates as follows. At 550, one programs or sets initial body-bias level(s) for desired portion or portions of the PLD. Subsequently, at 553B, one obtains one or more conditions or characteristics of the environment, circuit, or system in which the PLD operates. The conditions or characteristics may include a wide variety of items, as noted above.

Next, at 556B, the process checks to determine whether the conditions or characteristics of the operating environment make desirable higher performance levels of the PLD. (To use the example above, for instance, whether network traffic levels are relatively high, thus making higher PLD performance or throughput more desirable.) If not, at 559, the process leaves the body-bias level(s) unchanged. On the other hand, if higher PLD performance or throughput are desirable, at 562 the process adjusts, programs, or sets new or updated body-bias levels so as to reduce the difference between the actual and desired performance measure(s). The process then returns to 553B to check whether the effect of the new body-bias level(s) on the actual performance measure(s). The process may continue indefinitely or a given number of times, as desired.

One may use a variety of embodiments according to the inventive concepts, depending on factors such as design and performance specifications for a given application or implementation. For example, referring to FIG. 14, note that, similar to the embodiment described in connection with FIG. 13, one may take into account temperature level(s) of various parts of the PLD, as desired.

Figure 15:
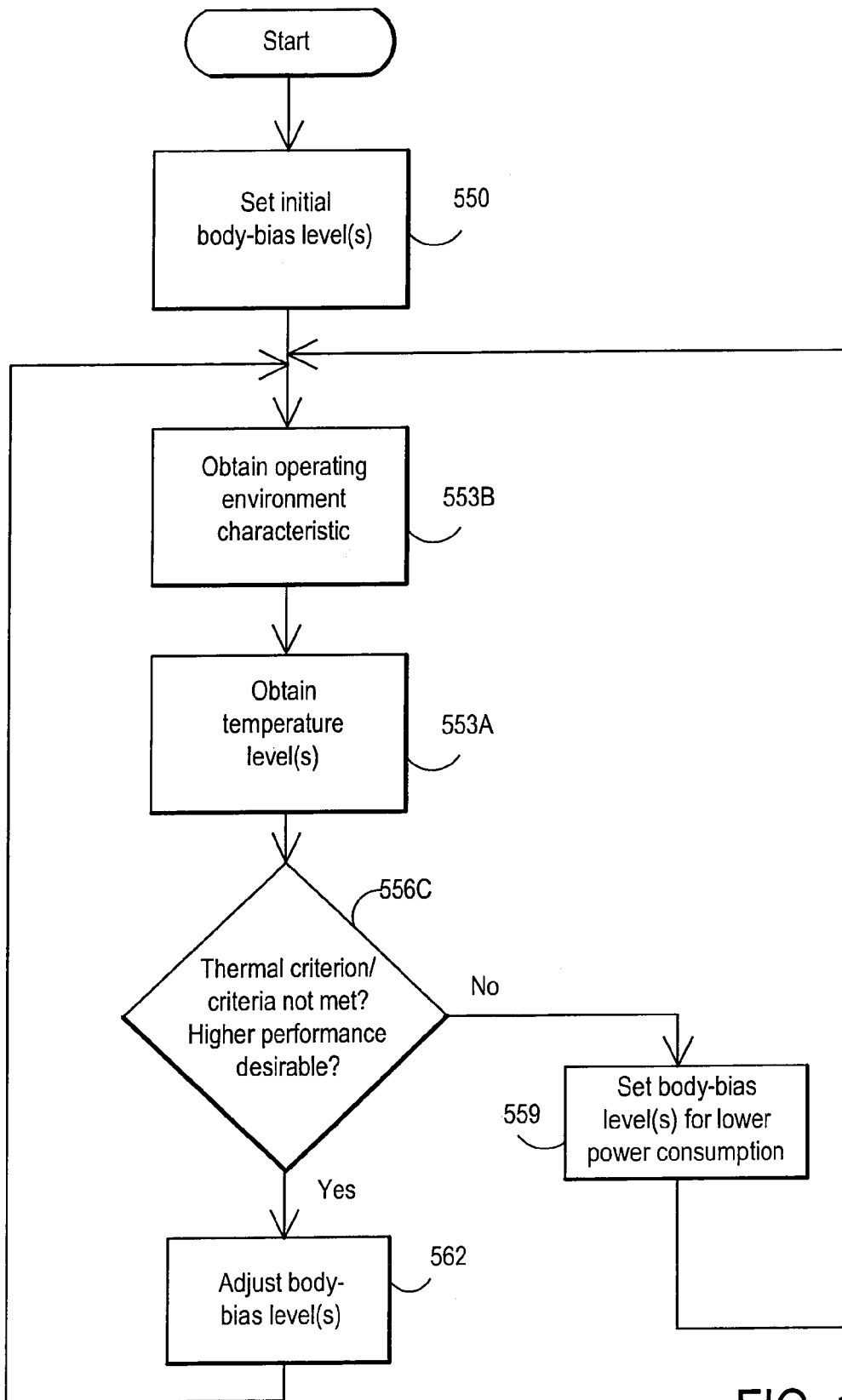
FIG. 15 depicts a flow diagram for a process or technique of adjusting, programming, or setting body-bias level(s) that takes into account temperature level(s) and the characteristics of the environment in which the PLD operates.

Put another way, one may examine not only the desirability of higher PLD performance or throughput, but also whether temperature level(s) or power densities within the PLD make increased PLD performance safe or appropriate. FIG. 15 shows a process for realizing such an embodiment. One may repeat the procedure a desired number of times, depending on the application. As noted above, one may implement the process or technique by using appropriate circuitry (or a combination of circuitry and software or firmware), such as control circuitry 136.

Furthermore, one may combine the performance-tuning concepts described above with other techniques to reduce power densities or keep them within safe ranges. For example, one may turn ON or OFF various circuits within the PLD (see FIG. 9 and accompanying description) to accomplish a tradeoff between desired performance levels and safe or prescribed power consumption levels or power densities. Other variations and embodiments will be apparent to persons of ordinary skill in the art who have the benefit of the description of the invention.

Generally, note that one may apply the inventive concepts effectively to various programmable logic circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A programmable logic device (PLD), comprising:
   a control circuitry;
   a body-bias generator coupled to the control circuitry, the body-bias generator configured to set a body bias of a transistor within the programmable logic device (PLD); and
   a variable impedance device coupled to the control circuitry, the variable impedance device configured to control power dissipation of a first circuit within the programmable logic device (PLD), wherein the first circuit comprises a circuit unused in an electronic circuit implemented by the programmable logic device (PLD).

2. The programmable logic device (PLD) according to claim 1, wherein the variable impedance device comprises a field-effect transistor (FET).

3. The programmable logic device (PLD) according to claim 2, wherein the body-bias generator is configured to set the body bias of the transistor so as to avoid thermal runaway within the programmable logic device (PLD).

4. The programmable logic device (PLD) according to claim 2, wherein the body-bias generator is further configured to adjust the body bias of the transistor so as to trade off performance and power consumption of the transistor.

5. The programmable logic device (PLD) according to claim 4, wherein the body-bias generator is further configured to adjust the body bias of the transistor so as to optimize the tradeoff between the performance and power consumption of the transistor.

6. The programmable logic device (PLD) according to claim 1, wherein the variable impedance device is further configured to shut down the first circuit by interrupting a supply of power to the first circuit.

7. The programmable logic device (PLD) according to claim 6, wherein the supply of power to the first circuit is provided by a supply-voltage circuit within the programmable logic device (PLD).

8. A programmable logic device (PLD), comprising:
   a temperature sensor, the temperature sensor configured to sense a temperature of a first circuit in the programmable logic device (PLD);
   a body-bias generator configured to set a body bias of a set of transistors in response to a control signal; and
   a control circuit coupled to the temperature sensor and the body-bias generator, the control circuit configured to provide the control signal in response to a signal received from the temperature sensor.

9. The programmable logic device (PLD) according to claim 8, wherein the control circuit is further configured to provide the control signal so as to avoid thermal runaway in the set of transistors.

10. The programmable logic device (PLD) according to claim 8, wherein the control circuit is further configured to provide the control signal so as to trade off performance and power consumption of the set of transistors.

11. The programmable logic device (PLD) according to claim 10, wherein the control circuit is further configured to provide the control signal so as to optimize the tradeoff between the performance and power consumption of the set of transistors.

12. The programmable logic device (PLD) according to claim 8, wherein the set of transistors resides in the first circuit.

13. The programmable logic device (PLD) according to claim 8, wherein the control circuit is further configured to derive the control signal from a reference signal and a signal received from the temDerature sensor.

14. A programmable logic device (PLD), comprising:
means for deriving a body-bias signal from at least one parameter related to the programmable logic device (PLD); and
means for providing the body-bias signal to a transistor in a first circuit within the programmable logic device (PLD) in response to an input signal provided by a configuration memory (CRAM), wherein the at least one parameter comprises either a temperature level or control information provided by a source external to the programmable logic device (PLD).

15. A programmable logic device (PLD), comprising:
means for deriving a body-bias signal from at least one parameter related to the programmable logic device (PLD); and
means for providing the body-bias signal to a transistor in a first circuit within the programmable logic device (PLD) in response to an input signal, wherein the at least one parameter comprises either a temperature level or control information provided by a source external to the programmable logic device (PLD), wherein the first circuit comprises a controller.

* * * * *